United States Patent [19]

Laridon et al.

[11] 4,411,978
[45] Oct. 25, 1983

[54] PHOTORESIST MATERIALS AND PROCESSES OF USING WITH PHOTOSENSITIVE NAPHTHOQUINONE DIAZIDES AND NITRONES

[75] Inventors: Urbain L. Laridon, Wilrijk; Hendrik E. Kokelenberg, Merksem; Rafaël P. Samijn, Hoboken, all of Belgium

[73] Assignee: AGFA-Gevaert N.V., Mortsel, Belgium

[21] Appl. No.: 885,998

[22] Filed: Mar. 13, 1978

[30] Foreign Application Priority Data

Mar. 15, 1977 [GB]  United Kingdom ............... 10903/77

[51] Int. Cl.$^3$ .......................... G03C 1/54; G03C 1/60; G03C 1/72; G03C 5/00
[52] U.S. Cl. .................... 430/157; 430/158; 430/191; 430/192; 430/275; 430/276; 430/270; 430/325; 430/326; 430/335; 430/336; 430/340; 430/343; 430/8; 430/321; 430/323
[58] Field of Search ............... 96/91 D, 115 R, 115 P, 96/90 R, 88, 86 R, 75, 35.1, 36; 430/191, 192, 157, 158, 275, 276, 325, 326, 270, 335, 336, 340, 343

[56] References Cited

U.S. PATENT DOCUMENTS

| | | | |
|---|---|---|---|
| 2,426,894 | 9/1947 | McQueen | 96/90 R |
| 3,416,922 | 12/1968 | Sus et al. | 96/90 R |
| 3,455,914 | 7/1969 | Ruckert | 96/33 |
| 3,481,739 | 12/1969 | Wainer et al. | 96/90 R |
| 3,494,767 | 2/1970 | Lavidon et al. | 96/91 D |
| 3,751,285 | 8/1973 | Ruckert et al. | 96/91 D |
| 3,827,887 | 8/1974 | Hazy et al. | 96/90 R |
| 3,890,152 | 6/1975 | Ruckert et al. | 96/91 D |
| 4,008,084 | 2/1977 | Ikada et al. | 427/248 H |
| 4,105,450 | 8/1978 | Shinozaki et al. | 96/91 D |

OTHER PUBLICATIONS

Kosar, J., "Light-Sensitive Systems", J. Wiley & Sons, 1965, pp. 359, 360 and 396.

Primary Examiner—Charles L. Bowers
Attorney, Agent, or Firm—William J. Daniel

[57] ABSTRACT

A photosensitive recording material which includes in a supported layer a mixture of photosensitive substances in admixture with one or more polymers that are soluble in an alkaline aqueous liquid, characterized in that such mixture of photosensitive substances essentially consists of:

(A) at least one photosensitive nitrone of the formula:

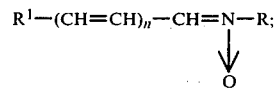

in which:
R is an aromatic hydrocarbon group including a substituted aromatic hydrocarbon group,
$R^1$ is an aromatic or heterocyclic group including these groups in substituted form,
n represents zero or 1, and (B) at least one photosensitive naphthoquinone-(1,2)-diazide (2) compound, that has a higher ultraviolet absorption in the wavelength range of 350 to 400 nm and a higher visible light absorption above 400 nm than each such nitrone has, the (A) and (B) compounds being present in such relative quantities to each other that the layer exhibits a relative decrease in solubility in an alkaline aqueous liquid upon a sufficient exposure to a UV-light and a relative increase in solubilty in such alkaline aqueous liquid upon a lesser exposure to visible light or to UV-light.

15 Claims, No Drawings

PHOTORESIST MATERIALS AND PROCESSES OF USING WITH PHOTOSENSITIVE NAPHTHOQUINONE DIAZIDES AND NITRONES

The present invention relates to photosensitive recording materials suited for use in the production of photoresists of either the negative or positive type depending upon the applied exposure.

Positive photoresist formulations as described e.g. in the U.S. Patent Specification No. 3,201,239 contain an alkali-soluble polymer such as a phenol-formaldehyde novolak resin in admixture with a photosensitive naphthoquinone-(1,2)-diazide (2) that is insoluble in alkali but becomes soluble therein by exposure to activating electromagnetic radiation.

When a recording layer so formulated is exposed to activating radiation the exposed portions can be dissolved in a high pH aqueous alkaline solution, referred to as a "developer." The selective removal of the exposed portions leaves a photoresist on a substrate, which serves e.g. as a printing form or as an etch resist in the production of printed circuits or miniaturised integrated electrical components.

Negative photoresist formulations i.e. those becoming less soluble in the developer on the photo-exposed portions are described e.g. in the United Kingdom Patent Specification No. 1,069,383. The photosensitive substance in this photoresist coating is a nitrone. In admixture therewith photosensitive quinone-diazides may be used, which like the rest of the coating become less soluble in the developer by exposure. Quinone-diazides that give rise to alkali-insoluble photodecomposition products are iminoquinone-diazides described in the German Patent Specification No. 901,500 and correspond to the following general formula:

R'—N=R=N=N wherein:
R represents a quinoide group derived from an aromatic nucleus, and
R' represents an aryl or an acyl group, or together with R forms a system of condensed nuclei.

As with the positive resist formulations, a suitable binding agent for the nitrones and imino-quinone-diazides is a novolak resin.

In order to expand the possibilities of photoresist formation with one material it would be interesting to provide a more versatile material that under the same developing conditions can yield either a negative or a positive resist pattern with respect to the same original dependent on the extent of photoexposure applied.

In accordance with the present invention a photosensitive recording material is provided, which material includes in a supported layer a mixture of photosensitive substances in admixture with one or more polymers that are soluble in an alkaline aqueous liquid, characterized in that said mixture of photosensitive substances essentially consists of
(A) at least one photosensitive nitrone of the formula:

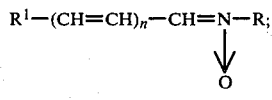

in which:
R is an aromatic hydrocarbon group including a substituted aromatic hydrocarbon group, and
R$^1$ is an aromatic or heterocyclic group including these groups in substituted form,
n is zero or 1, and
(B) at least one naphthoquinone-(1,2)-diazide (2) compound, that has a higher ultraviolet absorption in the wavelength range of 350 to 400 nm and a higher visible light absorption above 400 nm that each such nitrone has, and wherein the said (A) and (B) compounds are present in such relative quantities to each other that the layer may obtain a relative decrease in solubility in an alkaline aqueous liquid by exposure to a UV-light in a dose sufficient to effect said relative solubility decrease and that the layer may obtain a relative increase in solubility in an alkaline aqueous liquid by exposure to visible light or to UV-light in a dose to produce said relative solubility increase but not sufficient to produce said relative solubility decrease.

An exposure to UV-radiation of a given dose P causes the solubility-decreasing action of the photoproducts of the exposed nitrone to prevail over the solubility increasing action of the photoproducts of the exposed naphthoquinone-(1,2)-diazide. By exposure to ultraviolet radiation of a given dose Q substantially smaller than the dose P or by exposure to visible light with a wavelength above 400 nm the layer undergoes an increase in solubility in said liquid. By "substantially smaller" is meant here at least 10 times smaller.

Photosensitive nitrones suited for use according to the present invention can be prepared in a known manner e.g. by reaction of an aromatic aldehyde with an arylhydroxylamine (ref. U.S.-Patent Specifications Nos. 2,426,894 and 3,416,922).

Exemplary of aromatic hydrocarbon groups R$^1$ and R in the above formula are: phenyl, naphthyl, anthracyl, and phenanthryl and groups of higher ring systems such as naphthacene, chrysene, pyrene, perylene, coronene or acenaphthalene. Exemplary of heterocyclic groups R$^1$ are groups derived from furan, pyrrole, thiophene, pyrrazole, imidazole, triazole, thiazole, oxazole, isoxazole, indole, thionaphthene, benzofuran, indazole, carbazole, dibenzofuran, pyridine, pyridazine, pyrimidine, pyrazine, quinoline, quinazoline, acridine and phenazine.

The aforementioned hydrocarbon and heterocyclic groups may contain the following substituents: a straight or branched, saturated or unsaturated, aliphatic hydrocarbon group, preferably containing not more than 8 carbon atoms in the longest chain, e.g. a methyl, ethyl, propyl, isopropyl, butyl, 1,3-dimethyl-hexyl or propenyl (1) group, a saturated or unsaturated cyclic hydrocarbon group, e.g. a cyclopentyl, cyclohexyl, dimethylcyclohexyl, cyclopentene or cyclohexadiene group; an alkoxy, hydroxyalkyl or alkoxyalkyl group, e.g. a methoxy, ethoxy, propoxy, hydroxymethyl, hydroxyethyl, hydroxyisopropyl, methoxymethyl or ethoxymethyl group; a heterocyclic group; particularly in hydrogenated form, e.g. a morpholine group, an aromatic heterocyclic group, e.g. a pyridyl group; an aromatic hydrocarbon group, e.g. an aryl, alkaryl, aralkyl, alkaralkyl, alkoxyaryl, or hydroxyalkaryl group, e.g. a phenyl, naphthyl, tolyl, xylyl, benzyl, methoxyphenyl, methoxy-anthracyl or phenylmethoxy group; a halogenated aryl group, e.g. a chlorophenyl, bromophenyl or dichlorophenyl group; a halogen atom, e.g. chlorine or bromine, a nitro, hydroxyl or cyano group;

or an amino, alkylamino, dialkylamino, arylamino, diarylamino or aralkylamino group, e.g. a methylamino, propylamino, dimethylamino, diethylamino, dipropylamino, methylbutylamino, phenylamino, naphthylamino or benzylethylamino group.

The following Table contains examples of a number of particularly useful nitrones with their melting point and sensitivity maximum.

TABLE

| Compound | Structural formula | Melting point (°C.) | Sensitivity maximum (wavelength in nm) |
|---|---|---|---|
| 1 | Ph-CH=N(→O)-Ph | 109 | 317 |
| 2 | Naphthyl-CH=N(→O)-Ph | 134 | 349 |
| 3 | HO-C6H4-CH=N(→O)-Ph | 236 | 336 |
| 4 | 2-HO-C6H4-CH=N(→O)-Ph | 116 | 353 |
| 5 | O2N-C6H4-CH=N(→O)-Ph | 186 | 364 |
| 6 | H3CO-C6H4-CH=N(→O)-Ph | 115 | 334 |
| 7 | (2-thienyl)-CH=N(→O)-Ph | 88 | 346 |
| 8 | (2-furyl)-CH=N(→O)-Ph | 92 | 340 |
| 9 | (5-bromo-2-thienyl)-CH=N(→O)-Ph | 129 | 358 |

TABLE-continued

| Compound | Structural formula | Melting point (°C.) | Sensitivity maximum (wavelength in nm) |
|---|---|---|---|
| 10 | 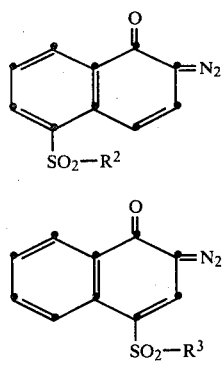 | 158 | 378 |

The preparation of naphthoquinone-(1,2)-diazides (2) is described in Beilstein, "Handbuch der organischen Chemie" 4th Ed., vol. 16 (1933) page 533.

For application in the present invention the naphthoquinone-(1,2)-diazides(2) may be substituted e.g. with halogen, an aryl group or substituted aryl group, a sulphonyl chloride group, a sulphonyl fluoride group, an ester group e.g. an aryl carboxylate group or an aryl sulphonate group including these groups in substituted form, a sulphonamide group or a N-arylsulphonamide group.

Representatives of substituted naphthoquinone-(1,2)-diazide (2) compounds correspond e.g. to one of the following general formulae (I) and (II):

(I)

(II)

wherein:
- $R^2$ represents a fluorine atom, a chlorine atom, an aryl group including a substituted aryl group, an aryloxy group including a substituted aryloxy group or an arylamino group including a substituted arylamino group, and
- $R^3$ represents a fluorine atom or an aryloxy group including a substituted aryloxy group.

Compounds according to at least one of said general formulae are described in the U.S. Patent Specifications Nos. 3,046,120-3,046,121-3,666,473, the United Kingdom Patent Specifications Nos. 941,837-937,121-1,350,773-1,127,996 and 1,116,674 and the published German Patent Applications Nos. (Dt-OS) 2,457,895-2,208,699 and 1,124,817.

Preferred for use according to the present invention are the naphthoquinone-(1,2)-diazide (2) compounds of general formula (I) wherein $R^2$ is an aryloxy group. These compounds are prepared by well-known methods of chemical synthesis, for example by reacting the corresponding sulphonic acid chloride of 2-diazonaphthol (1) with the elected aromatic hydroxy compound as described e.g. in the U.S. Patent Specification No. 3,046,121.

Generally speaking the bigger the molecules of the aromatic hydroxy compounds condensed with the diazo-naphthol sulphonic acid chloride are, the better the phototransformation proceeds. A naphthoquinone-(1,2)-diazide (2) is phototransformed into a ketocarbene that rearranges into a ketene (Wolff rearrangement). The ketene is converted by the alkaline developer into the corresponding carboxylic acid salt, which is responsible for the increase of the solubility of the exposed portions.

The naphthoquinone-(1,2)-diazide-(2)-5-sulphonic acid ester of 2,3,4-trihydroxybenzophenone described in the published German Patent Application No. 2,410,880 is particularly useful for the purpose of the present invention. This diazide compound has the following structural formula (A):

| | Sensitivity maxima at wavelength (λ): |
|---|---|
| | $\lambda_1$:349 nm<br>$\lambda_2$:401 nm<br>$\lambda_3$:420 nm |

Another particularly useful diazide compound is naphthoquinone(1,2)-diazide (2)-5-sulphonyl fluoride which is described in the United Kingdom Patent Specification 1,116,674 and has the following structural formula (B):

| | Sensitivity maxima at wavelength (λ): |
|---|---|
| | $\lambda_1$:354 nm<br>$\lambda_2$:397 nm<br>$\lambda_3$:418 nm |

For forming a photoresist layer the mixture of nitrone compound and naphthoquinone-(1,2)-diazide (2) is used in conjunction with at least one alkali-soluble polymer. Examples of alkali-soluble polymers suited for use according to the present invention belong to the class of copolymers of an unsaturated carboxylic acid, such as acrylic acid, methacrylic acid, crotonic acid, maleic acid, fumaric acid, itaconic acid, and citraconic acid. If the copolymer comprises an unsaturated dicarboxylic acid, the half-esters and half-amides thereof may be used as well. These unsaturated carboxylic acids are copolymerised with ethylenically unsaturated compounds which are substantially insoluble in alkaline medium and which are present in the copolymer in such a proportion that the copolymer itself remains soluble in alkaline medium. Ethylenically unsaturated compounds that can be used for the copolymerisation are styrene and the derivatives thereof, vinyl chloride, vinylidene chloride, vinyl esters such as vinyl acetate, acrylates, methacrylates, acrylonitrile, methacrylonitrile e.g. copoly(ethylene/maleic acid) and copoly(methacrylic acid/methyl methacrylate).

Particularly suitable polymers for use in admixture with the nitrone and naphtoquinone(1,2)-diazide(2) compounds are condensates of formaldehyde with phenol, which condensates are known as "novolaks". These polymers are highly acid-resistant, which is especially useful with regard to the resist formation on acid-etchable metal layers.

According to Fred W. Billmeyer in the "Textbook of Polymer Chemistry" Interscience Publishers, Inc., New York (1967) p. 350 novolaks are produced in acid solution by reaction of a high ratio of phenol to formaldehyde yielding a linear, soluble, fusible polymer having the structure:

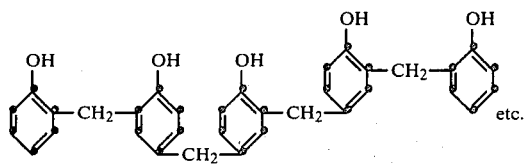

where ortho and para links occur at random. Molecular weights may range as high as 1000, corresponding to about ten phenyl groups. These materials do not themselves react further to give crosslinked resins. Further information about the preparation of novolaks can be found in C. Ellis "The Chemistry of Synthetic Resins" Volume 1 (1935), Reinhold Publishing Corp., New York, p. 303–309.

Good results are further obtained with condensates of formaldehyde with phenol or m-cresol, reacted with chloroacetic acid.

Likewise suited is a cellulose acetate phthalate having a degree of acetyl substitution (D.S. acetyl) between 1.0 and 1.7 and a degree of phthalyl substitution (D.S. phthalyl) between 0.6 and 1.2.

The proportions of alkali-soluble polymer and mixture of photosensitive nitrone and naphthoquinone (1,2)-diazide (2) compounds is preferably comprised between 1:1 and 7:1 by weight.

In preferred recording layers of materials according to the present invention from 2 to 6 parts by weight of nitrone are present with respect to 1 part by weight of naphthoquinone (1,2)-diazide (2) compound.

The compositions for forming the photoresist layer may be applied to any substrate known in the art. Metal supports or supports coated with metals such as for example zinc, and especially aluminium are excellently suited as base materials for a planographic printing plate. For the production of a planographic printing plate, there may be likewise used plates of stone or glass and specially treated sheets of paper or polymeric film supports coated with a metallic layer. For use in the production of intaglio or relief printing plates, metal base materials suited for etching are used e.g. metal plates or drums of zinc, copper, steel or an etchable magnesium alloy. For use in the production of printed circuits, the photoresist composition is applied e.g. to a supported copper layer, which can be easily etched.

In the production of miniaturized integrated electrical components the photoresist composition serves to form a shielding pattern on e.g. a semiconductor substrate or insulator whereon by techniques such as vapour deposition, oxidation, ion implantation, electrodeless deposition, ion-milling or etching matter is added or removed to offer the desired electronic properties to the non-shielded material.

As an example of a substrate used in the manufacture of semi-conductor components a silicon wafer is mentioned. The substrate will be subjected to several photolithographic steps, in the course of which the photoresist coating is exposed to a source of activating radiation through a high resolution photomask. The latter contains an arrangement of openings replicating the desired circuitry. The resist film pattern is subsequently developed by dissolving the more soluble parts of the resist in a suitable solvent. After effecting the desired change in the non-shielded parts of the substrate, the photoresist film pattern is stripped from the substrate.

The present photosensitive layers can likewise be used in the production of microimages. For that purpose the photoresist coatings are applied to a relatively thin highly opaque black or gray metal coating that can be etched and serves as imaging layer. Suited metal coatings are made of tellurium or a tellurium alloy having a thickness in the range of 50 nm to 500 nm or bismuth coatings having a thickness in the range of 25 nm to 300 nm.

According to one embodiment in the composition of the metallic imaging layer tellurium alloys comprising at least 50 atomic percent of tellurium are used. Typical tellurium compositions, which are etchable with an aqueous hypochlorite solution are e.g. a composition of 81 atomic parts of tellurium, 15 atomic parts of germanium, 2 atomic parts of antimony, and 2 atomic parts of sulphur; a composition of 92.5 atomic parts of tellurium, 2.5 atomic parts of germanium, 2.5 atomic parts of silicon, and 2.5 atomic parts of arsenic; a composition of 95 atomic parts of tellurium and 5 atomic parts of silicon; a composition of 90 atomic parts of tellurium, 5 atomic parts of germanium, 3 atomic parts of silicon and 2 atomic parts of antimony; a composition of 85 atomic parts of tellurium, 10 atomic parts of germanium and 5 atomic parts of bismuth; a composition of 85 atomic parts of tellurium, 10 atomic parts of germanium, 2.5 atomic parts of indium and 2.5 atomic parts of gallium; a composition of 85 atomic parts of tellurium, 10 atomic parts of silicon, 4 atomic parts of bismuth and 1 atomic part of thallium; a composition of 80 atomic parts of tellurium, 14 atomic parts of germanium, 2 atomic parts of bismuth, 2 atomic parts of indium and 2 atomic parts of sulphur; a composition of 70 atomic parts of tellurium, 10 atomic parts of arsenic, 10 atomic parts of germanium and 10 atomic parts of antimony; a composition of 60 atomic parts of tellurium, 20 atomic parts of germanium, 10 atomic parts of selenium and 10 atomic parts of sulphur; a composition of 60 atomic parts of tellurium, 20 atomic parts of germanium and 20 atomic parts of selenium; a composition of 60 atomic parts of tellurium, 20 atomic parts of arsenic, 10 atomic parts of germanium and 10 atomic parts of gallium; a composition of 81 atomic parts of tellurium, 15 atomic parts of germanium, 2 atomic parts of sulphur and 2 atomic parts of indium and many more, as described, e.g., in the U.S. Pat. Specifications Nos. 3,271,591 and 3,530,441.

For the chemical etching of tellurium-containing layers preferably aqueous hypochlorite solutions of 0.5 to 30% of sodium hypochlorite are used.

According to another and more preferred embodiment the imaging metal layer consists of bismuth. Bismuth possesses the advantage of directly adhering to organic resin supports such as a polyethylene terephthalate support when deposited thereon from bismuth vapour under reduced pressure conditions.

Vapour deposition techniques are sufficiently known to those skilled in the art e.g. of preparing photoconductive selenium coatings (see e.g. U.S. Pat. Specifications Nos. 3,874,917 and 3,884,688).

For the etching of the bismuth layer preference is given to aqueous acidic iron(III) chloride solution. The concentration of iron(III) chloride is e.g. in the range of 5 to 20% by weight. The solution contains preferably from 0.25 to 1% by weight of citric acid.

A likewise useful etching solution for the removal of bismuth is an aqueous solution containing 3 to 6% by weight of hydrogen peroxide and 5 to 10% by weight of sulphuric acid.

Bismuth forms a black, non-light-reflecting coating showing no crazing and for a same layer thickness provides a higher spectral density than tellurium does. Indeed, at a coating thickness of 200 nm tellurium offers a spectral density of about 3, whereas bismuth already at a coating thickness of 80 nm shows a spectral density of about 3. A 100 nm bismuth layer has a spectral density of about 5.

Bismuth layers having a coating thickness in the range of about 25 to about 50 nm corresponding with optical densities of about 0.5 to about 1.5 can be used as high energy radiation-sensitive recording medium as described e.g. in the published German Patent Application No. 2,514,801. The optical density of such bismuth coatings as well as of tellurium coatings can be reduced by a high energy light exposure capable of breaking up these coatings in small particles. A light energy dose of $0.5 \text{ J.cm}^{-2}$ emitted e.g. by a xenon flash tube is e.g. sufficient for breaking up these bismuth layers in small particles of coalesced bismuth. Hereby the optical density is reduced to 0.2–0.3. Instead of using a xenon flash tube whose light is modulated e.g. by contact exposure, the light energy of a powerful information-wise modulated laser beam can be utilized.

These bismuth layers may be formed in th size of microfiche or microform card in which the bismuth coating is divided up in image frames that may be produced therein by exposure of the overlying resist polymer layer through a line screen followed by resist development and metal etching. Such procedure and the imaging of said frames by image-wise coalescence of the bismuth may proceed e.g. as described in Example 10 of the United Kingdom Patent Application No. 22,806/76.

The metallic imaging layer of the micro image recording materials according to the present invention is preferably applied to a polymeric film support e.g. in the form of a sheet or belt. Preferably a polyethylene terephthalate support e.g. of 0.07 to 0.1 mm thickness is used.

The photosensitive materials according to the present invention are prepared by coating the ingredients forming the photosensitive layer to the selected substrate by a known coating technique e.g. by spin coating, whirl coating, spraying, dip coating, roller coating, air-knife coating, doctor-blade coating, etc.

Before their application in the form of a coating these ingredients are dissolved preferably in a low boiling solvent e.g. acetone that after the coating step is removed by evaporation.

The thickness of the dried photosensitive layer may be in the range of 0.5 to 20 μm but is preferably between 1 and 5 μm.

The present invention includes a recording method in which the above defined recording material is used to prepare a positive or negative photoresist dependent on the applied information-wise irradiation. By a positive photoresist is meant a resist whose non-irradiated portions of the photo-sensitive layer form the resist pattern. A negative photoresist is formed by the information-wise irradiated portions, which remain after selective removal of the non-irradiated portions.

The method for producing a positive photoresist comprises the steps of:
(1) information-wise exposing the photosensitive layer of said material to ultraviolet radiation and/or visible light of a dose sufficient to increase the solubility of the exposed portions by phototransformation of the naphthoquinone-(1,2)-diazide (2) compound(s) without substantially affecting the nitrone(s), and
(2) overall contacting the exposed photosensitive layer with an aqueous alkaline liquid to remove selectively the exposed portions of the photosensitive layer.

The method for producing a negative photoresist comprises the following steps:
(1) information-wise exposing the photosensitive layer of said material to ultraviolet radiation of a dose sufficient to decrease the solubility of the exposed portions by the photoproducts of the nitrone(s) that by said dose are formed in a higher amount than the photoproducts of the naphthoquinone-(1,2)-diazide (2) compound(s),
(2) overall exposing the photosensitive layer to ultraviolet radiation and/or visible light of a dose sufficient to improve the solubility of the initially non-exposed portions, and
(3) overall contacting the exposed photosensitive layer with an aqueous alkaline liquid to remove selectively the initially non-exposed portions of the photosensitive layer.

Commonly used ultraviolet radiation sources furnish an effective amount of ultraviolet radiation for carrying out said both embodiments. Suitable ultraviolet radiation sources are carbon arcs and mercury vapour lamps. Pulsed xenon lamps and tungsten lamps mainly emit in the visible light range and to a minor extent emit ultraviolet radiation. They are suitable exposure sources for carrying out the first embodiment.

The exposure may be an exposure through a contacted transparent master pattern or a projection exposure.

The information-wise exposure of the photosensitive layer is followed by the development with the alkaline aqueous developer. An alkaline aqueous liquid that yields particularly good development results and can be used for both the production of the positive and the negative photoresist is a 0.5 to 10% by weight aqueous solution of potassium hydroxide, or a 0.3 to 6.5% by weight aqueous solution of sodium hydroxide.

The processing of the photoexposed recording materials of the present invention is advantageously carried out in a processing apparatus, in which the material is transported automatically through processing stations in which the removal of the solubilized portions of the photosensitive layer and the etching of the bared imaging layer portions take place in successive stations.

For example in a particularly suitable processing apparatus for use in the production of metal images e.g. bismuth-images, a first station comprises a tray for holding an appropriate alkaline aqueous liquid, through which the photographic material is transported. After the resist development stage the surplus alkaline liquid absorbed in and adhering to the material is removed by passing the developed material through a second tray filled with plain water whereupon the material is led through a third tray containing a suitable etch solution for the bared portions of the metallic imaging layer. The processing is completed by carrying the material through a fourth tray containing plain water for rinsing the material. The processing preferably proceeds at room temperature (about 18° to about 25° C.) but may proceed at higher temperatures. Care must be taken, however, not to damage the resist layer.

The alkaline developing station and etching station can be arranged separately but preferably they are grouped in a compact unit, in which the photographic material is carried automatically at a constant speed from the resist developing tray into the other trays.

The total processing time in these trays normally lasts only about 30 seconds at 20°–30° C.

A useful processing apparatus is e.g. a common 4-tray processing station as used in the known four-bath silver halide-stabilization processing (see e.g. the United Kingdom Patent Specification No. 1,243,180 filed Oct. 11, 1967 by Gevaert-Agfa N.V.) more particularly the RAPIDOPRINT UNIT DD 1437 (RAPIDOPRINT is a trade-name of Agfa-Gevaert N.V., Mortsel, Belgium).

Thus, mass production of either positive or negative microform images is made possible by the present invention with a same recording material in a simple manner at high speed and in equipment of low unit cost.

The present invention includes the following examples for illustrative purposes without, however, limiting it thereto. All percentages or ratios are by weight, unless otherwise indicated.

EXAMPLE 1

Preparation of the recording material.

A photosensitive recording material suited for preparing an intermediate print in the production of a printing plate was produced as follows:

A bismuth layer of 150 nm having an optical density above 4 was applied by vapour deposition under reduced pressure to a polyethylene terephthalate sheet of 0.1 mm thickness.

To this layer a coating solution was applied consisting of:
- 0.5 g of the nitrone compound 1 of the Table,
- 0.1 g of the naphthoquinone (1,2)-diazide (2) of structural formula (A),
- 0.5 g of ALNOVOL PN 430 (trade name of Reichold Albert Chemie, W. Germany, for a novolak having a softening point of 126° C.),
- 26 ml of acetone, and
- 1.5 ml of ethylene glycol monomethyl ether.

The coating solution was applied at a thickness of 50 μm. The material was dried for 15 min at 80° C. and a dry photosensitive coating of 2 μm was obtained.

Procedure for the Preparation of a Positive Photoresist and Corresponding Positive Metal Image.

The photosensitive coating of the above prepared recording material was exposed in contact through a positive halftone transparency.

The exposure lasted 30 s and was carried out with a D7 Industrial Photoprinter CHEMCUT (trade name of Chemcut Corporation) source comprising six 20 W lamps placed at distance of 5 cm and emitting with a maximum at 350 nm.

The processing of the exposed material was carried out in a RAPIDOPRINT (trade name) DD 1437 4-tray processor in which the first tray contained a 3% aqueous solution of potassium hydroxide, the second tray contained water, the third tray contained an aqueous solution of 12% of iron(III) chloride and 1% of citric acid, and the fourth tray contained water. The total processing lasted 28 s.

A screened positive image with very contrasty screen dots was obtained.

Procedure for the Preparation of Negative Photoresist and Corresponding Negative Metal Image.

The photosensitive coating of the above prepared recording material was exposed in contact through a positive line transparency as original. The image-wise exposure lasted 5 min and proceeded with the above-identified ultraviolet radiation source of Chemcut Corporation. The image-wise exposure was followed by a 30 s overall exposure with the same radiation source.

The processing of the exposed material proceeded as for the production of the positive photoresist but a negative line image i.e. an image having reversed image values with respect to the original used in the exposure was obtained.

EXAMPLE 2

Preparation of the Recording Material.

The preparation of Example 1 was repeated except for the use of the following photosensitive coating composition:
- 0.3 g of the nitrone compound 6 of the Table,
- 0.1 g of the naphthoquinone (1,2)-diazide(2) of structural formula (A),
- 0.3 g of ALNOVOL PN 430 (trade name),
- 0.1 g of copoly(ethyl acrylate/methyl methacrylate/methacrylic acid) (17.5/52.5/30),
- 24.6 ml of acetone, and
- 2 ml of ethylene glycol monomethyl ether.

The dried coating had a thickness of 1.5 μm.

Procedure for the Preparation of a Positive Photoresist and Corresponding Positive Metal Image.

The photosensitive coating of the above prepared recording material was exposed in contact through a positive halftone transparency.

The exposure lasted 2 s and was carried out with the exposure apparatus SPECTRAPROOF containing a Hg/GaI$_3$ doped lamp of 3000 W having emission maxima at 400 and 420 nm. SPECTRAPROOF is a trade name of Theimer G.m.b.H.-W. Germany.

The processing proceeded as described in Example 1. A same result was obtained.

Procedure for the Preparation of a Negative Photoresist and Corresponding Negative Metal Image.

The photosensitive coating of the above prepared recording material was exposed in contact through a positive line transparency as original. The image-wise exposure lasted 1 min and proceeded with the above mentioned SPECTRAPROOF (trade name) apparatus. The image-wise exposure was followed by a 2 s overall exposure with the same exposure source.

The processing proceeded as described in Example 1. A same result was obtained.

EXAMPLE 3

Preparation of the Recording Material.

The preparation of Example 1 was repeated except for the use of the following photosensitive coating composition:
- 0.4 g of the nitrone compound 6 of the Table,
- 0.2 g of the naphthoquinone(1,2)-diazide(2) of structural formula (A),
- 0.3 g of ALNOVOL PN 430 (trade name),
- 0.1 g of copoly(ethyl acrylate/methyl methacrylate/methacrylic acid) (17.5/52.5/30),
- 31.3 ml of acetone, and
- 2 ml of ethylene glycol monomethyl ether.

The dried coating had a thickness of 1.5 μm. The processing for preparing a positive and negative photoresist proceeded as described in Example 2.

We claim:

1. A photosensitive recording material which comprises a supported layer containing a mixture of photosensitive substances in admixture with at least one polymer that is soluble in an alkaline aqueous liquid, characterized in that said mixture of photosensitive substances consists essentially of:

(A) at least one negative-working photosensitive nitrone of the formula:

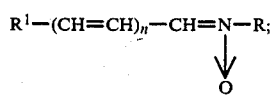

in which:
R is an aromatic hydrocarbon group
$R^1$ is an aromatic or heterocyclic group,
n represents zero or 1, and (B) at least one positive-working photosensitive naphthoquinone(1,2)-diazide (2) compound, having a higher ultraviolet absorption in the wavelength range of 350 to 400 nm and a higher visible light absorption above 400 nm than each such nitrone has, said (A) and (B) compounds being present in such relative quantities to each other that the layer exhibits a relative decrease in solubility in an alkaline aqueous liquid upon a sufficient exposure to a UV-light and a relative increase in solubility in an alkaline aqueous liquid upon a lesser exposure to visible light or to UV-light.

2. A material according to claim 1, wherein in the nitrone R is phenyl and $R^1$ is phenyl, naphthyl, hydroxyphenyl, nitrophenyl, alkoxyphenyl, furyl, thienyl or bromothienyl.

3. A material according to claim 1 wherein the naphthoquinone-(1,2)-diazide (2) compound corresponds to one of the following general formulae (I) or (II):

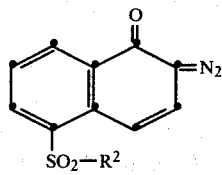

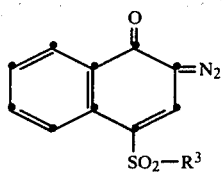

wherein:
$R^2$ represents a fluorine atom, a chlorine atom, an aryl group, an aryloxy group or an arylamino group, and
$R^3$ represents a fluorine atom or any aryloxy group.

4. A material according to claim 3, wherein the naphthoquinone-(1,2)-diazide(2) compound is naphthoquinone(1,2)-diazide-(2)-5-sulphonic acid ester of 2,3,4-trihydroxybenzophenone or naphthoquinone(1,2)-diazide(2)-5-sulphonyl fluoride.

5. A material according to claim 1, wherein the alkali-soluble polymer is a novolak.

6. A material according to claim 1, wherein the alkali-soluble polymer is a copolymer of an unsaturated carboxylic acid.

7. A material according to claim 1, wherein the weight ratio of alkali-soluble polymer to the mixture of said photosensitive compounds is between 1:1 and 7:1.

8. A material according to claim 1, wherein the layer contains from 2 to 6 parts by weight of nitrone with respect to 1 part by weight of naphthoquinone(1,2)-diazide(2) compound.

9. A material according to claim 1, wherein said layer has a thickness in the range of 0.5 to 20 μm.

10. A material according to claim 1, wherein said layer is present on a metal support.

11. A material according to claim 1, wherein said layer is present on a metallic layer that is present on a polymeric film support.

12. A material according to claim 11, wherein said metallic layer is made of tellurium or a tellurium alloy and has a thickness in the range of 50 nm to 500 nm.

13. A material according to claim 11, wherein said metallic layer is made of bismuth and has a thickness in the range of 25 nm to 300 nm.

14. A method for producing a positive photoresist comprising the steps of:
(1) information-wise exposing the photosensitive layer of the material according to claim 1 to ultraviolet radiation and/or visible light of a dose sufficient to increase the solubility of the exposed portions by phototransformation of the naphthoquinone-(1,2)-diazide(2) compound without substantially affecting the nitrone, and
(2) overall contacting the exposed photosensitive layer with an aqueous alkaline liquid to remove selectively the exposed portions of the photosensitive layer.

15. A method for producing a negative photoresist comprising the steps of:

(1) information-wise exposing the photosensitive layer of the material according to claim 1 to ultraviolet radiation of a dose sufficient to decrease the solubility of the exposed portions by the photoproducts of the nitrone which are formed by such exposure in a higher amount than are the photoproducts of the naphthoquinone-(1,2)-diazide(2) compound(s), (2) overall exposing the photosensitive layer to ultraviolet radiation and/or visible light of a dose substantially less than that of step 1 but sufficient to improve the solubility of the initially non-exposed portions, and (3) overall contacting the exposed photosensitive layer with an aqueous alkaline liquid to remove selectively the initially non-exposed portions of the photosensitive layer.

* * * * *